(12) United States Patent
Fukui et al.

(10) Patent No.: US 11,279,827 B2
(45) Date of Patent: Mar. 22, 2022

(54) CURING REACTIVE SILICONE GEL AND USE THEREOF

(71) Applicant: DOW CORNING TORAY CO., LTD., Tokyo (JP)

(72) Inventors: Hiroshi Fukui, Ichihara (JP); Kyoko Toyama, Ichihara (JP); Ryota Dogen, Ichihara (JP); Yoshito Ushio, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 524 days.

(21) Appl. No.: 16/607,012

(22) PCT Filed: Sep. 20, 2017

(86) PCT No.: PCT/JP2017/033869
§ 371 (c)(1),
(2) Date: Oct. 21, 2019

(87) PCT Pub. No.: WO2018/056297
PCT Pub. Date: Mar. 29, 2018

(65) Prior Publication Data
US 2020/0087514 A1    Mar. 19, 2020

(30) Foreign Application Priority Data

Sep. 26, 2016    (JP) .............................. JP2016-186544

(51) Int. Cl.
| | | |
|---|---|---|
| C08L 83/04 | (2006.01) | |
| C08G 77/12 | (2006.01) | |
| C08G 77/20 | (2006.01) | |
| C08K 5/14 | (2006.01) | |
| C09J 183/04 | (2006.01) | |
| H01L 23/24 | (2006.01) | |

(52) U.S. Cl.
CPC .............. *C08L 83/04* (2013.01); *C08G 77/12* (2013.01); *C08G 77/20* (2013.01); *C08K 5/14* (2013.01); *C09J 183/04* (2013.01); C08L 2203/16 (2013.01); C08L 2203/20 (2013.01); C08L 2205/03 (2013.01); C08L 2312/06 (2013.01); C08L 2312/08 (2013.01); H01L 23/24 (2013.01)

(58) Field of Classification Search
None
See application file for complete search history.

(56) References Cited

U.S. PATENT DOCUMENTS

| | | | |
|---|---|---|---|
| 4,740,480 A | 4/1988 | Ooka | |
| 4,921,926 A | 5/1990 | Motegi et al. | |
| 4,929,669 A | 5/1990 | Jensen | |
| 5,006,372 A | 4/1991 | Wolfer et al. | |
| 5,006,378 A | 4/1991 | Wolfer et al. | |
| 5,916,981 A | 6/1999 | Cifuentes et al. | |
| 5,985,371 A | 11/1999 | Fujioka et al. | |
| 6,075,112 A | 6/2000 | Irie et al. | |
| 6,235,862 B1 | 5/2001 | Isshiki et al. | |
| 8,957,153 B2 | 2/2015 | Kodama et al. | |
| 2004/0044132 A1 | 3/2004 | Kozakai et al. | |
| 2008/0262158 A1* | 10/2008 | Morita ................... H01L 23/296 | |
| | | | 525/100 |
| 2009/0294796 A1 | 12/2009 | Morita et al. | |
| 2010/0148378 A1 | 6/2010 | Katayama et al. | |
| 2011/0071266 A1 | 3/2011 | Morita et al. | |
| 2011/0104470 A1 | 5/2011 | Anderson et al. | |
| 2011/0306746 A1 | 12/2011 | Tanaka et al. | |
| 2012/0058334 A1 | 3/2012 | Okamoto et al. | |
| 2012/0146088 A1 | 6/2012 | Tanikawa et al. | |
| 2012/0157624 A1 | 6/2012 | Saito | |
| 2013/0042973 A1 | 2/2013 | Sakamoto | |
| 2013/0183776 A1 | 7/2013 | Kashiwagi et al. | |
| 2014/0322522 A1 | 10/2014 | Yoo | |
| 2015/0028497 A1 | 1/2015 | Nakamura et al. | |
| 2015/0115311 A1 | 4/2015 | Yoshida et al. | |
| 2015/0284590 A1 | 10/2015 | Endo et al. | |
| 2016/0208138 A1 | 7/2016 | Nishijima et al. | |
| 2017/0121462 A1 | 5/2017 | Fujisawa et al. | |
| 2018/0118939 A1* | 5/2018 | Zou ...................... C08G 77/12 | |
| 2018/0258332 A1 | 9/2018 | Song et al. | |
| 2019/0134946 A1 | 5/2019 | Choi et al. | |
| 2019/0169478 A1* | 6/2019 | Kong .......................... C09J 5/00 |
| 2020/0123417 A1* | 4/2020 | Kodama ................. C09J 11/04 |
| 2020/0164613 A1 | 5/2020 | Fukui et al. | |

FOREIGN PATENT DOCUMENTS

| | | | |
|---|---|---|---|
| CN | 102471585 A | 5/2012 | |
| CN | 103214852 A | 7/2013 | |
| EP | 0157508 A | 10/1985 | |

(Continued)

OTHER PUBLICATIONS

Machine assisted English translation of JPS60115661A obtained from https://worldwide.espacenet.com on Aug. 5, 2021, 5 pages.
Machine assisted English translation of JP4314454B2 obtained from https://patents.google.com/patent on Aug. 3, 2021, 9 pages.
Machine assisted English translation of JP2012096361A obtained from https://patents.google.com/patent on Aug. 3, 2021, 9 pages.
English translation of International Search Report for PCT/JP2017/033869 dated Dec. 19, 2017, 2 pages.
Machine assisted English translation of JPS59204259A obtained from https://worldwide.espacenet.com on Jan. 20, 2020, 5 pages.
Machine assisted English translation of JPS6148945A obtained from https://worldwide.espacenet.com on Jan. 20, 2020, 5 pages.

(Continued)

*Primary Examiner* — Marc S Zimmer

(74) *Attorney, Agent, or Firm* — Warner Norcross + Judd LLP

(57) ABSTRACT

A curing reactive silicone gel is provided. The curing reactive silicone gel is obtained by primarily curing a composition containing the following components in a gel form and further having secondarily curing reactivity. (A) an organopolysiloxane having at least two curing reactive groups in one molecule; (B) optionally, an organohydrogenpolysiloxane; and (C) a curing agent.

15 Claims, No Drawings

(56) References Cited

FOREIGN PATENT DOCUMENTS

| | | |
|---|---|---|
| EP | 3450159 A1 | 3/2019 |
| JP | S59204259 A | 11/1984 |
| JP | S60115661 A | 6/1985 |
| JP | S60196956 A | 10/1985 |
| JP | S618945 A | 1/1986 |
| JP | S6148945 A | 3/1986 |
| JP | S62104145 A | 5/1987 |
| JP | H01132664 A | 5/1989 |
| JP | H0273879 A | 3/1990 |
| JP | H10219197 A | 8/1998 |
| JP | H10324860 A | 12/1998 |
| JP | H11012546 A | 1/1999 |
| JP | 2000086897 A | 3/2000 |
| JP | 2002275450 A | 9/2002 |
| JP | 2003213132 A | 7/2003 |
| JP | 2004075918 A | 3/2004 |
| JP | 2006063092 A | 3/2006 |
| JP | 2006335857 A | 12/2006 |
| JP | 2007191629 A | 8/2007 |
| JP | 2007231195 A | 9/2007 |
| JP | 2008045091 A | 2/2008 |
| JP | 4314454 B2 | 8/2009 |
| JP | 2010159411 A | 7/2010 |
| JP | 2011153249 A | 8/2011 |
| JP | 2011526648 A | 10/2011 |
| JP | 2012017458 A | 1/2012 |
| JP | 2012096361 A | 5/2012 |
| JP | 2012219113 A | 11/2012 |
| JP | 2014088483 A | 5/2014 |
| JP | 5559345 B2 | 7/2014 |
| JP | 5561986 B2 | 7/2014 |
| JP | 5594232 B2 | 9/2014 |
| JP | 2014534296 A | 12/2014 |
| JP | 2015015324 A | 1/2015 |
| JP | 5794229 B2 | 10/2015 |
| JP | 2016124967 A | 7/2016 |
| KR | 1020130143665 A | 12/2013 |
| KR | 20150068389 A | 6/2015 |
| KR | 101579710 B1 | 12/2015 |
| KR | 20160048864 A | 5/2016 |
| WO | 2007132910 A1 | 11/2007 |
| WO | 2010131721 A1 | 11/2010 |
| WO | 2011056832 A1 | 5/2011 |
| WO | 2012140740 A1 | 10/2012 |
| WO | 20150155950 A2 | 4/2015 |
| WO | 2015079904 A1 | 6/2015 |
| WO | WO 2018/186165 * | 10/2018 |

OTHER PUBLICATIONS

Machine assisted English translation of JPS62104145A obtained from https://worldwide.espacenet.com on Jan. 20, 2020, 6 pages.
Machine assisted English translation of JP2002275450A obtained from https://patents.google.com on Jan. 20, 2020, 9 pages.
Machine assisted English translation of JP2003213132A obtained from https://patents.google.com on Jan. 20, 2020, 9 pages.
Machine assisted English translation of JP2007191629A obtained from https://patents.google.com on Jan. 20, 2020, 12 pages.
Machine assisted English translation of JP2008045091A obtained from https://patents.google.com on Jan. 20, 2020, 11 pages.
Machine assisted English translation of JP2011153249A obtained from https://patents.google.com on Jan. 20, 2020, 14 pages.
Machine assisted English translation of WO2012140740A1 obtained from https://patents.google.com on Jan. 20, 2020, 14 pages.
Machine assisted English translation of WO2015079904A1 obtained from https://patents.google.com on Jan. 20, 2020, 18 pages.
Machine assisted English translation of WO2015055950A1 obtained from https://patents.google.com on Jan. 20, 2020, 13 pages.
Machine assisted English translation of JP2016124967A obtained from https://patents.google.com on Jan. 20, 2020, 22 pages.
Machine assisted English translation of JP2015015324A obtained from https://patents.google.com on Jan. 20, 2020, 10 pages.
Machine assisted English translation of KR1020130143665A obtained from https://patents.google.com/patent on Aug. 24, 2021, 15 pages.
Machine assisted English translation of JP2014088483A obtained from https://patents.google.com/patent on Aug. 24, 2021, 12 pages.
Machine assisted English translation of JP5561986B2 obtained from https://patents.google.com/patent on Aug. 24, 2021, 10 pages.
Machine assisted English translation of JP2007231195A obtained from https://patents.google.com/patent on Sep. 1, 2021, 8 pages.
Machine assisted English translation of JP2010159411A obtained from https://patents.google.com/patent on Sep. 1, 2021, 12 pages.
Machine assisted English translation of JP2014088483A obtained from https://patents.google.com/patent on Sep. 1, 2021, 12 pages.
Machine assisted English translation of JPH10219197A obtained from https://patents.google.com/patent on Sep. 1, 2021, 11 pages.
Machine assisted English translation of JPS62104145A obtained from https://worldwide.espacenet.com/patent on Sep. 8, 2021, 3 pages.
Machine assisted English translation of KR1020130143665A obtained from https://patents.google.com/patent on Sep. 1, 2021, 15 pages.
Machine assisted English translation of JP2006335857A obtained from https://patents.google.com/patent on May 18, 2020, 11 pages.

* cited by examiner

CURING REACTIVE SILICONE GEL AND USE THEREOF

CROSS-REFERENCE TO RELATED APPLICATIONS

This application is the National Stage of International Appl. No. PCT/JP2017/033869 filed on 20 Sep. 2017, which claims priority to and all advantages of Japanese Appl. No. 2016-186544 filed on 26 Sep. 2016, the content of which is hereby incorporated by reference.

TECHNICAL FIELD

The present invention relates to a curing reactive silicone gel which changes its physical properties from a soft gel layer to a hard cured product layer by a secondarily curing reaction and its use.

BACKGROUND ART

Silicone gels can be obtained by curing reacting organopolysiloxanes having reactive functional groups so as to have low crosslink density, and are excellent in heat resistance, weather resistance, oil resistance, cold resistance, electrical insulation, and the like, and exhibit low elastic modulus, low stress, and excellent stress buffering properties because of being a gel form, unlike ordinary elastomer products, and are widely used for protecting damping materials for optical applications, in-vehicle electronic components, and consumer electronic components (for example, Patent Documents 1 to 7). In particular, since the silicone gel is soft and easily deformed and can be arranged in accordance with the unevenness of the surface of the substrate, unlike a silicone elastomer or a hard cured product, the silicone gel exhibits good formability even with respect to a substrate which is not flat, and has an advantage that a gap or a separation does not easily occur.

However, since such a silicone gel is a "gel-form", it is weak against deformation due to external stress such as vibration or internal stress due to expansion or contraction caused by temperature change, and in the case where the gel is destroyed or it is necessary to separate or cut (dice operation or the like) from an electronic member or the like requiring protection, adhesion or stress buffering, adhering deposits may remain on the object, or the gel may generate cohesive failure on the substrate, so that the gel cannot be easily removed from the substrate, the electronic component, or the like. Such gel deposits are not preferable because they may cause defects in electronic components and the like, and also cause troubles and defective products during mounting of semiconductors and the like. On the other hand, if the crosslink density of the organopolysiloxane is increased and completely cured, it is impossible to realize the properties of low elastic modulus, low stress, and excellent stress buffering properties which are the superiority of the silicone gel, and the followingness of the gel layer with respect to the uneven substrate is deteriorated, which may cause a gap and a separation from the substrate. For this reason, conventional cured products such as silicone gel materials and silicone elastomers have not been able to solve the above-mentioned problems at all.

On the other hand, in the field of adhesive films and semiconductor sealants, there has been proposed a curable composition in which a curing reaction proceeds in multiple stages, assuming different curing reaction conditions. For example, Patent Document 8 discloses a thermosetting composition which exhibits adhesiveness required in a dicing process by curing in a first stage and strong adhesiveness by curing in a second stage, by a two-stage curing reaction, and is suitably used in a dicing die bond adhesive sheet. Further, in Patent Document 9, the present applicants propose a curable silicone composition which is excellent in initial curability and maintains a high physical strength even when exposed to a high temperature of 250° C. or higher.

However, in the heretofore known curable compositions assuming multi-stage curing, there is no description or suggestion of the technical benefits of forming a silicone gel or changing from a soft gel to a hard completely cured product.

PRIOR ART DOCUMENTS

Patent Documents

Patent Document 1: JP 59-204259 A
Patent Document 2: JP 61-048945 A
Patent Document 3: JP 62-104145 A
Patent Document 4: JP 2003-213132 A (JP 3865638 B)
Patent Document 5: JP 2012-017458 A (JP 5594232 B)
Patent Document 6: WO 2015/155950 (JP 5794229 B)
Patent Document 7: JP 2011-153249 A
Patent Document 8: JP 2007-191629 A (JP 4628270 B)
Patent Document 9: JP 2016-124967 A

SUMMARY OF THE INVENTION

Problems to be Solved by the Invention

The present invention has been made to solve the above-mentioned problems, and an object thereof is to provide a curing reactive silicone gel which is a soft silicone gel excellent in heat resistance and the like, having low elastic modulus and low stress, and excellent in stress buffering properties and flexibility, and after curing, the silicone gel layer has higher shape retention than before curing and changes to a hard cured product excellent in mold releasability. Further, it is an object of the present invention to provide an application of the silicone gel: an adhesive, a protective agent or a sealant, and a member for manufacturing an electronic component, and further to provide an electronic component having a cured product of the curing reactive silicone gel.

Means for Solving the Problems

As a result of intensive studies, the present inventors have found that the above-mentioned problems can be solved by a curing reactive silicone gel which is obtained by primarily curing a composition containing the following components in a gel form and further has secondarily curing reactivity, and have arrived at the present invention.
(A) an organopolysiloxane having at least two curing reactive groups in one molecule;
(B) optionally, an organohydrogenpolysiloxane; and
(C) a curing agent.

Furthermore, the present inventors have found that the above-mentioned problems can be solved by an adhesive, a protective agent or a sealant, or a member for manufacturing an electronic component, which contains the curing reactive silicone gel, and have arrived at the present invention.

In addition, the present inventors have found that the above-mentioned problems can be solved by an electronic component having a cured product of the curing reactive silicone gel, and have arrived at the present invention.

That is, the object of the present invention is achieved by the following curing reactive silicone gel.

[1] A curing reactive silicone gel obtained by primarily curing a composition containing the following components in a gel form and further having secondarily curing reactivity:
(A) an organopolysiloxane having at least two curing reactive groups in one molecule;
(B) optionally, an organohydrogenpolysiloxane; and
(C) a curing agent.
[2] The curing reactive silicone gel according to [1], which has a loss factor, tan δ in the range of 0.01 to 1.00 at 23° C. to 100° C.
[3] The silicone gel according to [1] or [2], wherein a storage modulus ($G'_{cured}$) of a cured product of the curing reactive silicone gel obtained by a curing reaction is at least 100% larger than a storage modulus ($G'_{gel}$) of the silicone gel layer before curing.
[4] The curing reactive silicone gel according to any one of [1] to [3], which contains one or more curing agents selected from hydrosilylation reaction catalysts, peroxides and photopolymerization initiators.
[5] The curing reactive silicone gel according to any one of [1] to [4], wherein the primary curing is carried out in a temperature range of room temperature to 80° C.
[6] The curing reactive silicone gel according to any one of [1] to [5], which is secondarily curing reactive to heating, irradiation with high energy rays, or a combination thereof.
[7] The curing reactive silicone gel according to [1], wherein component (A) is a mixture of:
(A-1) a linear organopolysiloxane having at least two curing reactive groups in one molecule, and (A-2) a resinous or branched chain organopolysiloxane having at least two curing reactive groups in one molecule.
[8] The curing reactive silicone gel according to [1], wherein component (A) is a mixture of:
(A-1) a linear organopolysiloxane having at least two alkenyl groups or photopolymerizable functional groups in one molecule, and
(A-2) a resinous or branched chain organopolysiloxane having at least two alkenyl groups or photopolymerizable functional groups in one molecule,
component (B) is an organohydrogenpolysiloxane having at least two silicon atom-bonded hydrogen atoms in one molecule,
component (C) is a curing reaction catalyst containing hydrosilylation reaction catalyst, and
the silicon atom-bonded hydrogen atoms in component (B) are in the range of 0.25 mol or more with regard to 1 mol of the alkenyl groups in components (A-1) and (A-2) of the composition.
[9] The curing reactive silicone gel according to any one of [1] to [8], which is in the form of a film or sheet having an average thickness in the range of 10 to 500 μm.

The object of the present invention is also achieved by the use of a curable reactive silicone gel in the following form.
[10] An adhesive comprising the curing reactive silicone gel according to any one of [1] to [9].
[11] The adhesive of [10] used for manufacturing an electronic component.
[12] A protective agent or a sealant comprising the curing reactive silicone gel according to any one of [1] to [9].
[13] The protective agent or the sealant of [12] used for manufacturing an electronic component.

Similarly, the object of the present invention is achieved by the following electronic component and member for manufacturing an electronic component.
[14] An electronic component comprising a cured product of the curing reactive silicone gel according to any one of [1] to [9].
[15] A member for manufacturing an electronic component, comprising a cured product of the curing reactive silicone gel according to any one of [1] to [9].

Effects of the Invention

The curing reactive silicone gel of the present invention provides a soft silicone gel that is excellent in heat resistance, has low elastic modulus, low stress, and excellent stress buffering properties and flexibility before curing, and after curing, it is changed to a hard cured layer that is higher in shape retention and superior in mold releasability than before curing. Furthermore, by using the curing reactive silicone gel of the present invention, it is possible to provide an adhesive, a protective agent or a sealant, and a member for manufacturing an electronic component, which hardly cause problems such as adhesion of a silicone gel or a cured product thereof to a substrate or an electronic component, and which hardly cause problems such as defects of an electronic component or a defective product, and furthermore, it is possible to provide an electronic component having a cured product of the curing reactive silicone gel.

MODE FOR CARRYING OUT THE INVENTION

Curing Reactive Silicone Gel

A curing reactive silicone gel of the present invention exhibits a non-fluid gel form, and causes a curing reaction in response to heating, irradiation with high energy rays, or the like, and changes to a hard cured product having higher shape retention and superior mold releasability than before curing reaction. The shape of the silicone gel is not particularly limited, but it is preferable to have a layered shape, and when it is used for manufacturing an electronic component to be described later, it is preferable to have a substantially flat silicone gel layer. The thickness of the silicone gel layer is not particularly limited, but the average thickness may be in the range of 10 to 500 μm, in the range of 25 to 300 μm, or in the range of 30 to 200 μm. If the average thickness is less than 10 μm, gaps derived from unevenness on a substrate are difficult to fill, and if the average thickness is more than 500 μm, it may be uneconomical to use a silicone gel layer for arrangement at the time of temporary retention/processing of an electronic component, in particular, in an electronic component manufacturing application.

The silicone gel is an organopolysiloxane crosslinked product having a relatively low crosslink density, and from the viewpoints of flexibility, low elastic modulus, low stress and stress buffering properties required for the gel, a loss factor, tan δ (measured from a viscoelasticity measuring device at a frequency of 0.1 Hz) of the silicone gel is preferably in the range of 0.01 to 1.00 at 23° C. to 100° C., and more preferably in the range of 0.03 to 0.95 and 0.10 to 0.90 at 23° C. In the silicone gel of the present invention, the curing reaction hardly proceeds rapidly at 50° C. or lower, preferably 80° C. or lower, more preferably 100° C. or lower, and the loss factor, tan δ of the silicone gel satisfies the above range in the above temperature range.

The silicone gel is characterized in that it is curing reactive and changes from the above-mentioned gel form properties and physical properties to a hard cured product having higher shape retention and excellent mold releasability. More specifically, the storage elastic modulus $G'_{cured}$ of the cured product of the silicone gel obtained by the curing reaction is preferably at least 100% larger than the storage elastic modulus $G'_{gel}$ of the silicone gel before curing, and more preferably 150% or more, 200% or more, or 300% or more larger than the storage elastic modulus $G'_{gel}$ of the silicone gel before curing. That is, the larger the $G'_{cured}/G'_{gel}$ is, the more the soft and flexible gel form material is changed to the hardened material having higher shape retention.

The curing reaction mechanism of the silicone gel is not particularly limited, but may include, for example, a hydrosilylation reaction curing type by an alkenyl group and a silicon atom-bonded hydrogen atom; a dehydration condensation reaction curing type or a dealcoholization condensation reaction curing type by a silanol group and/or a silicon atom-bonded alkoxy group; a peroxide curing reaction type using an organic peroxide; and a radical reaction curing type by high energy ray irradiation to a mercapto group or the like, and it is desirable to use a hydrosilylation reaction curing type, a peroxide curing reaction type, a radical reaction curing type or the combination thereof since the whole is cured relatively quickly and the reaction can be easily controlled. These curing reactions proceed with heating, irradiation with high energy radiation, or a combination thereof.

When the silicone gel is cured by heating, it includes at least a step of curing the whole by a curing reaction by heating at a temperature exceeding 100° C., preferably at a temperature exceeding 120° C., more preferably at 150° C. or higher, and most preferably at 170° C. or higher. Heating at 150° C. or higher is particularly suitably employed when the curing reaction mechanism of the silicone gel is particularly a peroxide curing reaction type mechanism or a curing reaction mechanism including an encapsulated hydrosilylation reaction catalyst. In practice, a range of from 120° C. to 200° C. or from 150 to 180° C. is suitably chosen. Although it is also possible to heat-cure at a relatively low temperature of 50° C. to 100° C., it is preferable that the silicone gel of the present invention maintains a gel form at a low temperature, and therefore, in particular, it is preferable that the curing reaction does not substantially proceed, i.e., the gel form is maintained at a temperature of 50° C. or lower.

Examples of the high-energy rays (also referred to as active energy rays) include ultraviolet rays, electron beams, radiation, and the like, but ultraviolet rays are preferable from the viewpoint of practicality. As the ultraviolet ray generating source, a high-pressure mercury lamp, a medium-pressure mercury lamp, a Xe—Hg lamp, a deep UV lamp, or the like is suitable, and in particular, ultraviolet irradiating with a wavelength of 280 to 400 nm, preferably with a wavelength of 350 to 400 nm is preferable. The irradiation amount in this case is preferably 100 to 10,000 mJ/cm$^2$. When the silicone gel is cured by high energy rays, a selective curing reaction is possible regardless of the above-mentioned temperature conditions.

Practically, a preferable curing operation, a preferable curing reaction mechanism and conditions for curing the curing reactive silicone gel of the present invention are as follows. The heating time or the irradiation amount of the ultraviolet rays can be appropriately selected in accordance with the thickness of the silicone gel, the intended physical properties after curing, and the like.
(i) Heating operation of silicone gel at 120 to 200° C.: hydrosilylation reaction curing type, peroxide curing reaction type, or a combination thereof.
(ii) Ultraviolet irradiation operation on silicone gel: radical reaction curing type by high energy ray irradiation, hydrosilylation reaction curing type using photoactive platinum complex curing catalyst, or combination thereof.
(iii) Combinations of curing operations, curing mechanisms and conditions of the above (i) and (ii), particularly combinations of simultaneous or staggered curing operations, are included.

The curing reactive silicone gel is obtained as a gel form cured product of a curable silicone composition (primarily curing reaction). Here, unreacted curing reactive functional groups or unreacted organic peroxides are present in the silicone crosslinked product constituting the silicone gel, and further curing reaction (secondarily curing reaction) proceeds by the above-mentioned curing operation to form a hard cured product having a higher crosslink density. When the curable silicone composition is used as a starting material, a curing reactive silicone gel layer, which is a constituent element of the present invention, is obtained by a primarily curing reaction, and further, the silicone gel is changed to a harder cured layer by a secondarily curing reaction. In the curing reaction including the peroxide curing reaction, the silicone gel layer can be cured even if the functional group is not curing reactive in another curing reaction mechanism such as an alkyl group.

The primarily curing reaction mechanism for forming a silicone gel from a curable silicone composition is not particularly limited, and includes, for example, a hydrosilylation reaction curing type by an alkenyl group and a silicon atom-bonded hydrogen atom; a dehydration condensation reaction curing type or a dealcoholization condensation reaction curing type by a silanol group and/or a silicon atom-bonded alkoxy group; a peroxide curing reaction type by the use of an organic peroxide; a radical reaction curing type by high energy ray irradiation to a mercapto group or the like; and a hydrosilylation reaction curing type by high energy ray irradiation using a photoactive platinum complex curing catalyst or the like. The (secondarily) curing reaction mechanism of the silicone gel and the primarily curing reaction mechanism when forming the silicone gel may be the same or different. For example, after a silicone gel is formed on a substrate by a dehydration condensation reaction, a dealcoholization condensation reaction, or high energy ray irradiation without performing a heating operation, the silicone gel layer may be heated at a high temperature to cure the silicone gel. When the same curing mechanism is selected as the primarily curing reaction for obtaining the silicone gel from the curable silicone composition and the secondarily curing reaction for further curing the silicone gel, it is necessary that the unreacted curing reactive groups and the unreacted curing agents remain in the silicone gel obtained by primarily curing the curable silicone composition. When the primarily curing reaction and the secondarily curing reaction are peroxide curing reactions, the reactive functional group is not necessarily required, and when a sufficient amount of unreacted organic peroxide is present in the silicone gel as a curing agent, the secondarily curing reaction proceeds by the organic peroxide.

As described above, since the silicone gel is curing reactive, it is preferable to contain one or more curing agents selected from a hydrosilylation reaction catalyst, an organic peroxide, and a photopolymerization initiator. These curing agents may be encapsulated, and in particular encapsulated curing agents, specifically hydrosilylation reaction catalysts, may be suitably used in view of the storage stability of the silicone gel and the control of the curing reaction. Furthermore, a hydrosilylation reaction catalyst such as a photoactive platinum complex curing catalyst that promotes a hydrosilylation reaction by high energy ray irradiation such as ultraviolet rays may be used.

These curing agents can be left in an unreacted state in the silicone gel by designing the amount of the curing agents such that when the curing reactive silicone gel is formed by primarily curing the curable silicone composition, the curing agents remain in the silicone gel even after primarily curing, or by selecting conditions so that the primarily curing reaction and the secondarily curing reaction after the formation of the silicone gel are different curing reactions, and adding the curing agents corresponding to each curing reaction, or the like.

As the hydrosilylation reaction catalyst, platinum-based catalysts, rhodium-based catalysts, and palladium-based catalysts are exemplified, and platinum-based catalysts are preferable because the curing of the present composition can be remarkably accelerated. Examples of the platinum-based catalyst include platinum fine powder, chloroplatinic acid, an alcohol solution of chloroplatinic acid, a platinum-alkenyl siloxane complex, a platinum-olefin complex, a platinum-carbonyl complex, and a catalyst in which these platinum-based catalysts are dispersed or encapsulated with a thermoplastic resin such as silicone resin, polycarbonate resin, acrylic resin or the like, with a platinum-alkenyl siloxane complex particularly preferable. Examples of this alkenyl siloxane include: 1,3-divinyl-1,1,3,3-tetramethyldisiloxane; 1,3,5,7-tetramethyl-1,3,5,7-tetravinylcyclotetrasiloxane; an alkenyl siloxane obtained by substituting part of methyl groups of these alkenyl siloxanes with an ethyl group, a phenyl group, etc.; and an alkenyl siloxane obtained by substituting part of vinyl groups of these alkenyl siloxanes with an allyl group, a hexenyl group, etc. In particular, 1,3-divinyl-1,1,3,3-tetramethyldisiloxane is preferable because the platinum-alkenylsiloxane complex has good stability. As the catalyst for promoting the hydrosilylation reaction, a non-platinum metal catalyst such as iron, ruthenium, iron/cobalt, or the like may be used.

In addition, in the curing reactive silicone gel of the present invention, a particulate platinum-containing hydrosilylation reaction catalyst dispersed or encapsulated with a thermoplastic resin may be used. The use of such encapsulated curing agents provides the advantages of improved storage stability of the curing reactive silicone gel and control over the temperature of the curing reaction, in addition to the advantages of improved conventional handling workability and improved pot life of the composition. That is, at the time of forming the silicone gel by the primarily curing reaction, the encapsulated curing agent can be left in an unreacted and inert state in the silicone gel by selecting a temperature condition under which the thermoplastic resin (wall material of the capsule containing the curing agent) such as wax which forms the capsule does not melt. This can be expected to improve the storage stability of the silicone gel containing the curing agent. Furthermore, by selecting a high temperature condition exceeding the melting temperature of the thermoplastic resin which forms the capsule in the curing reaction (secondarily curing reaction) of the silicone gel, the reaction activity of the curing agent in the capsule can be selectively expressed only at a specific high temperature condition. This makes it possible to easily control the curing reaction of the silicone gel. The thermoplastic resin (wall material of the capsule containing the curing agent) such as wax or the like can be appropriately selected in accordance with the temperature condition for forming the silicone gel and the temperature condition for curing the curing reactive silicone gel, and the curing agent is not limited to the platinum-containing hydrosilylation reaction catalyst.

In the present invention, besides heating, a hydrosilylation reaction catalyst such as a photoactive platinum complex curing catalyst that promotes a hydrosilylation reaction by high energy ray irradiation such as ultraviolet rays may be used. Such a hydrosilylation reaction catalyst is preferably exemplified by a platinum complex having a β-diketone platinum complex or a cyclic diene compound as its ligand, and platinum complexes selected from the group consisting of trimethyl(acetylacetonato)platinum complex, trimethyl(2,4-pentanedionate)platinum complex, trimethyl(3,5-heptanedionate) platinum complex, trimethyl(methylacetoacetate) platinum complex, bis(2,4-pentanedionato)platinum complex, bis(2,4-hexanedionato)platinum complex, bis(2,4-heptanedionato)platinum complex, bis(3,5-heptanedionato) platinum complex, bis(1-phenyl-1,3-butanedionato)platinum complex, bis(1,3-diphenyl-1,3-propanedionato) platinum complex, (1,5-cyclooctadienyl)dimethyl platinum complex, (1,5-cyclooctadienyl)diphenyl platinum complex, (1,5-cyclooctadienyl)dipropyl platinum complex, (2,5-norboradiene)dimethyl platinum complex, (2,5-norboradiene) diphenyl platinum complex, (cyclopentadienyl)dimethyl platinum complex, (methylcyclopentadienyl)diethyl platinum complex, (trimethylsilylcyclopentadienyl)diphenyl platinum complex, (methylcycloocta-1,5-dienyl)diethyl platinum complex, (cyclopentadienyl)trimethyl platinum complex, (cyclopentadienyl)ethyldimethyl platinum complex, (cyclopentadienyl)acetyldimethyl platinum complex, (methylcyclopentadienyl)trimethyl platinum complex, (methylcyclopentadienyl)trihexyl platinum complex, (trimethylsilylcyclopentadienyl)trimethyl platinum complex, (trimethylsilylcyclopentadienyl)trihexyl platinum complex, (dimethylphenylsilylcyclopentadienyl)triphenyl platinum complex, and (cyclopentadienyl)dimethyltrimethylsilylmethyl platinum complex are specifically exemplified.

In the case of using a curing agent that promotes a hydrosilylation reaction by the above-mentioned high energy ray irradiation, the silicone gel can be formed by the primarily curing reaction or the curing reaction of the silicone gel by the secondarily curing can proceed without performing a heating operation using the curable silicone composition as a raw material.

The content of the hydrosilylation reaction catalyst is preferably an amount in which the metal atoms are in the range of 0.01 to 500 ppm, an amount in the range of 0.01 to 100 ppm, or an amount in the range of 0.01 to 50 ppm in terms of mass unit, when the entire silicone gel is 100 parts by mass.

Examples of organic peroxides include alkyl peroxides, diacyl peroxides, ester peroxides, and carbonate peroxides. In particular, when curing of the curing reactive silicone gel layer is allowed to proceed selectively at a high temperature, a 10-hour half-life temperature of the organic peroxide is preferably 70° C. or higher, and may be 90° C. or higher. In the case of selecting high energy ray irradiation in the primarily curing reaction for forming the silicone gel, it is preferable to select an organic peroxide which is not deactivated by the primarily curing.

Examples of alkyl peroxides include dicumyl peroxide, di-tert-butyl peroxide, di-tert-butylcumyl peroxide, 2,5-dimethyl-2,5-di(tert-butylperoxy)hexane, 2,5-dimethyl-2,5-di (tert-butylperoxy)hexyne-3, tert-butylcumyl, 1,3-bis(tert-butylperoxyisopropyl)benzene, and 3,6,9-triethyl-3,6,9-trimethyl-1,4,7-triperoxonan.

Examples of diacyl peroxides include benzoyl peroxide such as p-methylbenzonyl peroxide, lauroyl peroxide and decanoyl peroxide.

Examples of ester peroxides include 1,1,3,3-tetramethylbutylperoxyneodecanoate, α-cumylperoxyneodecanoate, tert-butylperoxyneodecanoate, tert-butylperoxyneoheptanoate, tert-butylperoxypivalate, tert-hexylperoxypivalate, 1,1,3,3-tetramethylbutylperoxy-2-ethylhexanoate, tert-amylperoxy-2-ethyl hexanoate, tert-butylperoxy-2-ethylhexanoate, tert-butylperoxyisobutyrate, di-tert-butylperoxyhexahydroterephthalate, tert-amylperoxy-3,5,5-trimethylhexanoate, tert-butylperoxy-3,5,5-trimethylhexanoate, tert-butylperoxyacetate, tert-butylperoxybenzoate, and di-butylperoxytrimethyladipate.

Examples of carbonate peroxides include di-3-methoxybutyl peroxydicarbonate, di(2-ethylhexyl)peroxydicarbonate, diisopropyl peroxycarbonate, tert-butyl peroxyisopropylcarbonate, di(4-tert-butylcyclohexyl)peroxydicarbonate, dicetyl peroxydicarbonate, and dimyristyl peroxydicarbonate.

The organic peroxides preferably have a 10-hour half-life temperature of 70° C. or higher, and may be 90° C. or higher, or may be 95° C. or higher. Examples of such organic peroxides include p-methylbenzonyl peroxide, dicumyl peroxide, di-tert-butyl peroxide, di-tert-hexyl peroxide, tert-butylcumyl peroxide, 2,5-dimethyl-2,5-di(tert-butylperoxy)hexane, 1,3-bis(tert-butylperoxyisopropyl)benzene, di-(2-tert-butylperoxyisopropyl)benzene, and 3,6,9-triethyl-3,6,9-trimethyl-1,4,7-triperoxonan.

The content of the organic peroxide is not limited, but it is preferably in the range of 0.05 to 10 parts by mass or in the range of 0.10 to 5.0 parts by mass when the entire silicone gel is 100 parts by mass.

Photopolymerization initiators are components that generate radicals by high energy ray irradiation such as ultraviolet rays and electron beams, and include for example, acetophenone and its derivatives such as acetophenone, dichloroacetophenone, trichloroacetophenone, tert-butyltrichloroacetophenone, 2,2-diethoxyacetophenone, and p-dimethylaminoacetophenone; benzoin and its derivatives such as benzoin, benzoin methyl ether, benzoin ethyl ether, benzoin butyl ether, and benzoin n-butyl ether; benzophenone and its derivatives such as benzophenone, 2-chlorobenzophenone, p,p'-dichlorobenzophenone, and p,p'-bisdiethylaminobenzophenone; p-dimethylaminopropiophenone, Michler's ketone, benzyl, benzyl dimethyl ketal, tetramethyl thiuram monosulfide, thioxanthone, 2-chlorothioxanthone, 2-methylthioxanthone, azoisobutyronitrile, benzoin peroxide, di-tert-butylperoxide, 1-hydroxycyclohexyl phenyl ketone, 2-hydroxy-2-methyl-1-phenyl-propan-1-one, 1-(4-isopropylphenyl)-2-hydroxy-2-methylpropane-1-one,
methyl benzoyl formate, diphenyl sulfide, anthracene, 1-chloroanthraquinone, diphenyl disulfide, diacetyl, hexachlorobutadiene, pentachlorobutadiene, octachlorobutadiene, and 1-chloromethyl naphthalene are exemplified, and preferably are acetophenone, benzoin, benzophenone, and derivatives thereof.

The blending amount of the photopolymerization initiator is not particularly limited, but is preferably in the range of 0.1 to 10 parts by mass with respect to 100 parts by mass of the entire silicone gel.

When the silicone gel contains a photopolymerization initiator as a curing agent, the silicone gel may contain a photosensitizer such as n-butylamine, di-n-butylamine, tri-n-butylphosphine, allylthiourea, s-benzyl isothiuronium-p-toluene sulfinate, triethylamine, diethylaminoethyl methacrylate, or the like as other optional components.

As long as the silicone gel according to the present invention is a silicone gel having the above-mentioned curing reactivity, it is not particularly limited in the composition of the curable silicone composition as a raw material and the primarily curing condition, but it is preferable that the storage stability at room temperature to 100° C. after the formation of the silicone gel layer is good and the gel form is maintained, and that the secondarily curing reaction is selectively progressed by irradiation with high energy rays or heating at 100° C. or higher, preferably at 120° C. or higher, more preferably at 150° C. or higher, and that the control thereof is easy. For this reason, in particular, in the case of designing such that the curing reaction of the silicone gel proceeds selectively at a high temperature, it is preferable to cure the curable silicone composition as a raw material thereof into a gel form at a temperature range of room temperature to 100° C., that is, at a relatively low temperature. In particular, when a curing mechanism including a hydrosilylation curing reaction or a curing reaction by an organic peroxide is selected as a secondarily curing reaction after forming a silicone gel, since these curing reactions do not sufficiently proceed at a low temperature of 100° C. or lower, there is an advantage that a curing reactive functional group or a curing agent remains unreacted in the silicone gel formed by the primarily curing reaction in the above-mentioned temperature range, and a curing reactive silicone gel layer that can be selectively cured at a high temperature can be easily obtained.

Such a curing reactive silicone gel is preferably one in which a curable silicone composition containing at least a resinous or branched chain organopolysiloxane is cured in a gel form, particularly when a hydrosilylation reaction is selected as a primarily curing reaction, and in particular, it is preferable that a curable silicone composition containing a resinous organopolysiloxane having at least two alkenyl groups in one molecule is cured in a gel form. The resinous or branched chain curing reactive organopolysiloxane is an organopolysiloxane that contains a tetrafunctional siloxy unit represented by $SiO_{4/2}$ or a trifunctional siloxy unit represented by $RSiO_{3/2}$ (wherein R is a monovalent organic group or a hydroxyl group), and has a curing reactive functional group capable of forming a silicone gel by a primarily curing reaction.

Curable Silicone Composition

The curing reactive silicone gel of the present invention is obtained by primarily curing a curable silicone composition into a gel form. As described above, the primarily curing reaction for forming the silicone gel layer may be a curing reaction mechanism different from the secondarily curing reaction of the silicone gel itself, or may be the same curing reaction mechanism. On the other hand, from the viewpoint of the stability of the silicone gel layer at 100° C. or lower, it is preferable to cure the curable silicone composition into a gel form in a temperature range of room temperature to 100° C.

Such a curable silicone composition contains (A) an organopolysiloxane having at least two curing reactive groups in one molecule and (C) a curing agent, optionally (B) an organohydrogenpolysiloxane. In particular, when the primarily curing reaction or the secondarily curing reaction is a reaction mechanism of a hydrosilylation reaction curing type, the component (A) is preferably a mixture of (A-1) a linear organopolysiloxane having at least two curing reactive groups in one molecule and (A-2) a resinous or branched chain organopolysiloxane having at least two curing reactive groups in one molecule, and the curable silicone composition further contains (B) an organohydrogenpolysiloxane and (C) a curing agent. Here, the curing reactive group is not particularly limited, but a photopolymerizable functional group such as an alkenyl group or a mercapto group is exemplified.

The curable silicone composition forms a curing reactive silicone gel by a curing reaction such as a hydrosilylation reaction curing type by an alkenyl group and a silicon atom-bonded hydrogen atom; a dehydration condensation reaction curing type or a dealcoholization condensation reaction curing type by a silanol group and/or a silicon atom-bonded alkoxy group; a peroxide curing reaction type by the use of an organic peroxide; a radical reaction curing type by high energy ray irradiation to a mercapto group or the like; or a hydrosilylation reaction curing type by high energy ray irradiation using a photoactive platinum complex curing catalyst or the like, depending on a primarily curing mechanism. When the peroxide curing reaction is selected, a functional group such as an alkyl group which is not curing reactive in other curing reaction mechanisms can be cured into a gel form in some cases.

When the primarily curing reaction is a hydrosilylation curing reaction, the curing reactive group includes at least an alkenyl group, in particular an alkenyl group having 2 to 10 carbon atoms. The alkenyl group having 2 to 10 carbon atoms includes a vinyl group, an allyl group, a butenyl group, and a hexenyl group. Preferably, the alkenyl group having 2 to 10 carbon atoms is a vinyl group.

Similarly, when the primarily curing reaction is a hydrosilylation curing reaction, the curable silicone composition preferably contains an organohydrogenpolysiloxane having two or more Si—H bonds in a molecule as a crosslinking agent. In this case, the alkenyl group of the organopolysiloxane can hydrosilylate with the silicon atom-bonded hydrogen atom of the organohydrogenpolysiloxane to form a curing reactive silicone gel layer. In this case, it is necessary to use the same hydrosilylation reaction catalyst as described above.

As described above, the primarily curing reaction of the present invention is preferably performed at 100° C. or lower, preferably at 80° C. or lower. When the primarily curing reaction is a hydrosilylation curing reaction, high energy ray irradiation using a photoactive platinum complex curing catalyst or the like may be performed, and the curing reaction may not proceed sufficiently at a low temperature to form a gel form cured product having a low crosslink density.

When the curing reaction is a dehydration condensation reaction curing type or a dealcoholization condensation reaction curing type, the above-mentioned curing reactive group is a silanol group (Si—OH) or a silicon atom-bonded alkoxy group, and an alkoxy group having 1 to 10 carbon atoms such as a methoxy group, an ethoxy group, or a propoxy group is suitably exemplified as the alkoxy group. The alkoxy group may be attached to the side chain or end of the organopolysiloxane, may be in the form of an alkylalkoxysilyl group or an alkoxysilyl group containing group attached to a silicon atom via other functional groups, and is preferred. Further, the organopolysiloxane having the curing reactive group may have a functional group of a dehydration condensation reaction curing type or a dealcoholization condensation reaction curing type, and a curing reactive group by another curing mechanism in the same molecule. For example, in addition to a silicon atom-bonded alkoxy group or a silanol group, a hydrosilylation reactive functional group or a photopolymerizable functional group may be present in the same molecule. It should be noted that one of the preferred forms of the present invention is to use a curable silicone composition of a dehydrated condensation reaction curing type or a dealcoholization condensation reaction curing type, containing an organic peroxide to form a gel form curing layer by a condensation reaction, and then to secondarily cure the gel layer with the organic peroxide by heating or the like, since the functional group having the curing reactivity is not required in the peroxide curing reaction.

In particular, when a silicon atom-bonded alkoxy group is selected as the curing reactive group, an alkoxysilyl group containing group represented by the general formula of a silicon atom bond:

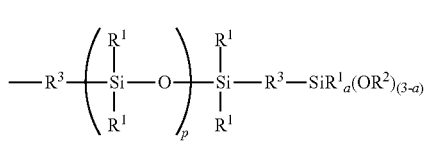

[Formula 1]

is suitably exemplified.

In the above formula, $R^1$ is a monovalent hydrocarbon group having no aliphatic unsaturated bond, which is the same or different, and is preferably a methyl group or a phenyl group. $R^2$ is an alkyl group, and is preferably a methyl group, an ethyl group, or a propyl group because it constitutes an alkoxy group having dealcoholization condensation reactivity. $R^3$ is an alkylene group bonded to a silicon atom, and is preferably an alkylene group having 2 to 8 carbon atoms. a is an integer of 0 to 2, and p is an integer of 1 to 50. From the viewpoint of dealcoholization condensation reactivity, most preferably, a is 0, and a trialkoxysilyl group containing group is preferable. In addition to the above alkoxysilyl group containing group, a functional group having hydrosilylation reactivity or a functional group having photopolymerization reactivity may be contained in the same molecule.

When the primarily curing reaction is a dehydration condensation reaction curing type or a dealcoholization condensation reaction curing type, the above-mentioned crosslinking agent is unnecessary, but an organohydrogenpolysiloxane may be included in order to proceed the secondarily curing reaction.

In the case of a dehydration condensation reaction curing type or a dealcoholization condensation reaction curing type, it is preferable to use a condensation reaction catalyst as a curing agent. The condensation reaction catalyst is not particularly limited, and examples thereof include organic tin compounds such as dibutyltin dilaurate, dibutyltin diacetate, tin octenate, dibutyltin dioctate, and tin laurate; organic titanium compounds such as tetrabutyl titanate, tetrapropyl titanate, and dibutoxy bis(ethyl acetoacetate); acidic compounds such as hydrochloric acid, sulfuric acid, and dodecylbenzene sulfonic acid; alkaline compounds such as ammonia and sodium hydroxide; amine-based compounds such as 1,8-diazabicyclo[5.4.0]undecene (DBU), and 1,4-diazabicyclo[2.2.2]octane (DABCO).

When the primarily curing reaction is a peroxide curing reaction, the above-mentioned curing reactive group may be a radical reactive functional group by peroxide, and a peroxide curing reactive functional group such as an alkyl group, an alkenyl group, an acrylic group, or a hydroxyl group can be used without limitation. However, as described above, since the peroxide curing reaction generally proceeds at a high temperature of 150° C. or higher, in a laminate of the present invention, it is preferable that the peroxide curing reaction is selected as the curing of the silicone gel layer, that is, the secondarily curing reaction. This is because, under a temperature condition in which the peroxide curing reaction proceeds, including a functional group having a high energy ray curing reactivity, the curing reaction by most of the curing reactivity functional groups is completely terminated and a gel-form cured product layer cannot be obtained in some cases. Since some organic peroxides may be deactivated by high energy ray irradiation, it is preferable to appropriately select the type and amount of the organic peroxides in accordance with the primarily curing reaction.

When the primarily curing reaction is of the radical reaction curing type by high energy ray irradiation, the curing reactive functional group is a photopolymerizable functional group, and is a mercaptoalkyl group such as a 3-mercaptopropyl group and an alkenyl group similar to those described above, or an acrylamide group such as N-methylacrylamidopropyl. Here, the conditions under which the high energy ray irradiation is irradiated are not particularly limited, and for example, a method in which the composition is irradiated at room temperature or while being cooled or heated to 50 to 150° C. in air, in an inert gas such as nitrogen gas, argon gas, helium gas, or the like, or in a vacuum is given, and it is particularly preferable to irradiate the composition at room temperature in air. In addition, since some of the photopolymerizable functional groups may cause poor curing by being in contact with air, the surface of the curable silicone composition may optionally be coated with a synthetic resin film or the like which transmits high energy rays at the time of high energy ray irradiation. Here, when the curable silicone composition is primarily cured into a gel form at room temperature by using ultraviolet rays having a wavelength of 280 to 450 nm, preferably 350 to 400 nm, there is an advantage that the secondarily curing reaction can be easily controlled by selecting the thermal curing reaction as the secondarily curing reaction, since the curing system accompanied by other heating, in particular, the curing reactive group and the curing agent of the hydrosilylation curing reaction or the peroxide curing reaction can be left unreacted in the curing reactive silicone gel layer.

The curing reactive silicone gel is formed from a curable silicone composition containing (A) an organopolysiloxane having a curing reactive group as described above, (B) an organohydrogenpolysiloxane depending on a curing reaction, and (C) a curing agent, and in the case where the hydrosilylation curing reaction is included in either the primarily curing reaction for forming the silicone gel layer of the present invention or the secondarily curing reaction for forming the cured layer from the silicone gel layer, it is preferable that the curable silicone composition contains (A-1) a linear organopolysiloxane having at least two curing reactive groups in one molecule and (A-2) a resinous or branched chain organopolysiloxane having at least two curing reactive groups in one molecule.

Component (A-1) is a linear organopolysiloxane having at least two curing reactive groups in one molecule. The property of component (A-1) at room temperature may be an oil or a raw rubber, and the viscosity of component (A-1) is preferably 50 mPas or more, especially 100 mPas or more, at 25° C. In particular, when the curable silicone composition is in a solvent form, it is preferable that component (A-1) has a viscosity of 100,000 mPas or more at 25° C. or is a raw rubber-form component having a plasticity degree. However, even lower viscosity (A-1) components can be used.

Component (A-2) is a resinous or branched chain organopolysiloxane having at least two curing reactive groups in one molecule, and in particular the use of a resinous curing reactive organopolysiloxane (organopolysiloxane resin) having at least two curing reactive groups in one molecule is particularly preferred. Examples of component (A-2) may include, for example, a resin composed of $R_2SiO_{2/2}$ units (D units) and $SiO_{3/2}$ units (T units) (wherein each R is independently a monovalent organic group or a hydroxyl group), and having at least two curing reactive groups, hydroxyl groups or hydrolyzable groups in the molecule, a resin composed of the T units alone and having at least two curing reactive groups, hydroxyl groups or hydrolyzable groups in the molecule, and a resin composed of R3SiO1/2 units (M units) and SiO4/2 units (Q units), and having at least two curing reactive groups, hydroxyl groups or hydrolyzable groups in the molecule, and the like. In particular, it is preferable to use a resin (also referred to as MQ resin) composed of R3SiO1/2 units (M units) and SiO4/2 units (Q units), and having at least two curing reactive groups, hydroxyl groups or hydrolyzable groups in the molecule. The hydroxyl groups or hydrolyzable groups are directly bonded to silicon of the T units or Q units in the resin, and are groups derived from silane as a raw material or generated as a result of hydrolysis of silane.

The curing reactive functional groups of component (A-1) and component (A-2) may be functional groups relating to the same curing reaction mechanism or may be substances relating to different curing reaction mechanisms. The curing reactive functional groups of component (A-1) and component (A-2) may be functional groups relating to two or more types of curing reaction mechanisms different in the same molecule. For example, component (A-1) or component (A-2) may be an organopolysiloxane having a photopolymerizable functional group and/or a hydrosilylation reactive functional group and a condensation reactive functional group in the same molecule, the structure of which is linear in component (A-1) and resinous or branched chain in component (A-2). When a hydrosilylation reaction is used in either the primarily curing reaction or the secondarily curing reaction, it is preferable to include component (A-2), but as described above, component (A-2) may be a resinous or branched chain organopolysiloxane having a functional group relating to two or more different curing reaction mechanisms, and is preferable.

Component (B) is an organohydrogenpolysiloxane and is an optional crosslinking component or molecular chain extending component. In particular, when the curing reactive functional group is an alkenyl group and the curing agent contains a hydrosilylation reaction catalyst, it is preferable to contain component (B). Preferably, component (B) is an organohydrogenpolysiloxane having two or more Si—H bonds in the molecule.

Component (C) is a curing agent, which is one or more curing agents selected from the hydrosilylation reaction catalysts, the organic peroxides, and the photopolymerization initiators described above.

To the extent that the technical effect of the present invention is not impaired, the curable silicone composition may include components other than those described above. For example, the composition may include: a curing retardant; an adhesion imparting agent; a non-reactive organopolysiloxane such as polydimethylsiloxane or polydimethyldiphenylsiloxane; an antioxidant such as a phenol type, a quinone type, an amine type, a phosphorus type, a phosphite type, a sulfur type, or a thioether type; a light stabilizer such as a triazole type or a benzophenone type; a flame retardant such as a phosphate ester type, a halogen type, a phosphorus type, or an antimony type; one or more antistatic agents consisting of a cationic surfactant, an anionic surfactant, or a non-ionic surfactant, and the like; a dye; a pigment; a reinforcing filler; a thermoconductive filler; a dielectric filler; an electrically conductive filer; a releasable component; and the like.

In particular, the reinforcing filler is a component which imparts mechanical strength to the silicone gel and improves thixotropy, and may be capable of suppressing the silicone gel layer from softening and lowering or deforming the shape retention due to heating or the like when the silicone gel layer is subjected to the secondarily curing reaction. This is effective in efficiently suppressing a situation in which the electronic component or the like arranged on the silicone gel layer is buried in the silicone gel layer or in which it is difficult to separate the electronic component or the like from the cured layer. In addition, the blending of the reinforcing filler may further improve the mechanical strength, the shape retention, and the surface releasability of the cured product after the secondarily curing reaction. Examples of such reinforcing fillers include inorganic fillers such as fumed silica fine powder, precipitated silica fine powder, calcined silica fine powder, fumed titanium dioxide fine powder, quartz fine powder, calcium carbonate fine powder, diatomaceous earth fine powder, aluminum oxide fine powder, aluminum hydroxide fine powder, zinc oxide fine powder, zinc carbonate fine powder. The reinforcing fillers may contain inorganic fillers obtained by surface treating these inorganic fillers with a treating agent such as organoalkoxysilanes such as methyltrimethoxysilane, organohalosilanes such as trimethylchlorosilane, organosilanes such as hexamethyldisilazane, siloxane oligomers such as α,ω-silanol group-capped dimethylsiloxane oligomer, α,ω-silanol group-capped methylphenylsiloxane oligomer, and α,ω-silanol group-capped methylvinylsiloxane oligomer, and the like.

The thermally conductive filler or the electrically conductive filler is a component which imparts thermal conductivity or electrical conductivity to the silicone rubber cured product obtained by curing the present composition as desired, and exemplified by a metal fine powder such as gold, silver, nickel, copper, or the like; a fine powder obtained by depositing or plating a metal such as gold, silver, nickel, copper, or the like on the surface of a fine powder such as ceramic, glass, quartz, organic resin, or the like; a metal compound such as aluminum oxide, aluminum nitride, zinc oxide, or the like; and a mixture of two or more of these. Particularly preferred are silver powder, aluminum powder, aluminum oxide powder, zinc oxide powder, aluminum nitride powder or graphite. When electrical insulation is required for the present composition, a metal oxide powder or a metal nitride powder is preferable, and in particular, aluminum oxide powder, zinc oxide powder, or aluminum nitride powder is preferable. Further, it is preferable that the thermally conductive filler or the electrically conductive filler is heated and mixed with the above component (B) and the like at a temperature of 100 to 200° C. under reduced pressure. In particular, component (B) is a siloxane having an alkoxysilyl containing group, and in some case, a surface treatment of a thermally conductive filler or an electrically conductive filler can provide a composition having a low viscosity and excellent handling workability even if it is highly filled.

The average particle diameter of such a thermally conductive filler or an electrically conductive filler is preferably in the range of 1 to 100 μm in terms of median diameter, and particularly preferably in the range of 1 to 50 μm.

The curable silicone composition may also optionally contain an organic solvent such as toluene, xylene, acetone, methyl ethyl ketone, methyl isobutyl ketone, hexane, and heptane; a non-crosslinkable diorganopolysiloxane such as α,ω-trimethylsiloxy group-capped dimethylpolysiloxane, and a, w-trimethylsiloxy group-capped methylphenylpolysiloxane; a flame retardant such as carbon black; an antioxidant such as hindered phenol-type antioxidants; a heat resistant agent such as iron oxide; a plasticizer such as dialkylsiloxane oligomers capped at both molecular chain terminals with hydroxydialkylsiloxane groups; in addition, a pigment, a thixotropic agent, and an antifungal agent, as long as the object of the present invention is not impaired.

In particular, when a hydrosilylation reaction is selected in either the reaction of primarily curing the curable silicone composition into a gel form or the reaction of secondarily curing the silicone gel, it is preferable to blend a hydrosilylation reaction inhibitor as a curing retardant. Examples of the curing retardant include: alkyne alcohols such as 2-methyl-3-butyne-2-ol, 3,5-dimethyl-1-hexyne-3-ol, 2-phenyl-3-butyne-2-ol, 1-ethynyl-1-cychlohexanol; enyne compounds such as 3-methyl-3-pentene-1-yne, 3,5-dimethyl-3-hexene-1-yne; alkenyl group-containing low molecular weight siloxanes such as tetramethyltetravinylcyclotetrasiloxane and tetramethyltetrahexenylcyclotetrasiloxane; and alkynyloxysilanes such as methyl tris(1,1-dimethyl propynyloxy)silane and vinyl tris(1,1-dimethyl propynyloxy)silane. The content of the curing retardant is not limited, but is preferably within the range of 10 to 10,000 ppm in terms of mass units, with regard to the curable silicone composition.

As the adhesion imparting agent, an organosilicon compound having at least one alkoxy group bonded to a silicon atom in one molecule is preferable. Examples of this alkoxy group include a methoxy group, an ethoxy group, a propoxy group, a butoxy group, and a methoxyethoxy group, with a methoxy group particularly preferable. Moreover, examples of groups other than alkoxy group, bonded to the silicon atom of the organosilicon compound include: halogen substituted or unsubstituted monovalent hydrocarbon groups such as an alkyl group, an alkenyl group, an aryl group, an aralkyl group, and a halogenated alkyl group; glycidoxyalkyl groups such as a 3-glycidoxypropyl group and a 4-glycidoxybutyl group; epoxycyclohexylalkyl groups such as a 2-(3,4-epoxycyclohexyl)ethyl group and a 3-(3,4-epoxycyclohexyl)propyl group; epoxyalkyl groups such as a 3,4-epoxybutyl group and a 7,8-epoxyoctyl group; acryl group-containing monovalent organic groups such as a 3-methacryloxypropyl group; and hydrogen atoms. This organosilicon compound preferably has a group that may react with an alkenyl group or a silicon atom-bonded hydrogen atom in this composition, and specifically, preferably has a silicon atom-bonded hydrogen atom or an alkenyl group. Moreover, because favorable adhesion can be imparted to various substrates, this organosilicon compound preferably has at least one epoxy group-containing monovalent organic group in one molecule. Examples of such an organosilicon compound include an organosilane compound, an organosiloxane oligomer, and an alkyl silicate. Examples of the molecular structure of this organosiloxane oligomer or alkyl silicate include a linear structure, a partially branched linear structure, a branched structure, a cyclic structure, and a network structure, with a linear structure, a branched structure, and a network structure particularly preferable. Examples of an organosilicon compound include: silane compounds such as 3-glycidoxypropyltrimethoxysilane, 2-(3,4-epoxycyclohexyl)ethyltrimethoxysilane, and 3-methacryloxypropyltrimethoxysilane; siloxane compounds having at least one silicon atom-bonded alkenyl group or at least one silicon atom-bonded hydrogen atom and at least one silicon atom-bonded alkoxy group; mixtures of silane compounds or siloxane compounds having at least one silicon atom-bonded alkoxy group and siloxane compounds having at least one silicon atom-bonded hydroxy group and at least one silicon atom-bonded alkenyl group in one molecule; methylpolysilicate; ethylpolysilicate; and an epoxy group-containing ethylpolysilicate. The adhesion imparting agent is preferably in the form of a low viscosity liquid, and its viscosity is not limited, but it is preferably within the range of 1 to 500 mPas at 25° C. In addition, while not limited thereto, the content of this adhesion imparting agent is preferably within the range of 0.01 to 10 parts by mass with regard to 100 parts by mass of the total of the curable silicone composition.

Particularly preferably, the silicone gel of the present invention has an alkenyl group or a photopolymerizable functional group as a curing reactive group in either the primarily curing reaction of the curable silicone composition or the secondarily curing reaction of the silicone gel, and includes an organohydrogenpolysiloxane as a crosslinking agent, and these are preferably cured by a hydrosilylation reaction catalyst. That is, the silicone gel layer according to the present invention is preferably obtained by curing a curing reactive silicone composition composed of a linear organopolysiloxane having at least two alkenyl groups or photopolymerizable functional groups in one molecule as component (A-1), a resinous or branched chain organopolysiloxane having at least two alkenyl groups or photopolymerizable functional groups in one molecule as component (A-2), a crosslinking agent including an organohydrogenpolysiloxane having at least two silicon atom-bonded hydrogen atoms in one molecule as component (B), and a curing reaction catalyst containing a hydrosilylation reaction catalyst as component (C) into a gel form. Note that component (C) may further contain an organic peroxide, and even if the above-mentioned curing reactive functional group is consumed at the time of gel formation in the primarily curing reaction, the secondarily curing reaction proceeds by heating.

Here, the content of each component in the composition is an amount by which the curable silicone composition is capable of being primarily cured in a gel form and the silicone gel after the primarily curing reaction is capable of being secondarily-cured. In the case where the primarily curing reaction is a hydrosilylation curing reaction, when the total of alkenyl groups in component (A) in the composition is 1 mol, the amount of the silicon atom-bonded hydrogen atoms in component (B) is preferably 0.25 mol or more, more preferably 0.26 mol or more.

In this case, suitable examples of component (A-1) include dimethylsiloxane/methylvinylailoxane copolymer capped at both molecular chain terminals with trimethylsiloxy groups, dimethylsiloxane/methylvinylailoxane/methylphenylsiloxane copolymer capped at both molecular chain terminals with trimethylsiloxy groups, dimethylpolysiloxane capped at both molecular chain terminals with dimethylvinylsiloxy groups, methylphenylpolysiloxane capped at both molecular chain terminals with dimethylvinylsiloxy groups, dimethylsiloxane/methylvinylsiloxane copolymer capped at both molecular chain terminals with dimethylvinylsiloxy groups, dimethylsiloxane/methylvinylsiloxane copolymer capped at both molecular chain terminals with dimethylphenylsiloxy groups, and dimethylpolysiloxane capped at both molecular chain terminals with methylvinylphenylsiloxy groups.

Similarly, suitable component (A-2) is a resinous organopolysiloxane having a radical reactive group when heated in the presence of a hydrosilylation reactive group and/or high energy ray irradiation or an organic peroxide, and examples of such component (A-2) include MQ resins, MDQ resins, MTQ resins, MDTQ resins, TD resins, TQ resins, and TDQ resins comprised of an arbitrary combination of triorganosiloxy units (M-units) (organo groups are methyl groups only, methyl groups and vinyl groups or phenyl groups), diorganosiloxy units (D-units) (organo groups are methyl groups only, methyl groups and vinyl groups or phenyl groups), monoorganosiloxy units (T-units) (organo groups are methyl groups, vinyl groups, or phenyl groups), and siloxy units (Q-units).

Similarly, examples of suitable component (B) include methylphenylpolysiloxane capped at both molecular chain terminals with dimethylhydrogensiloxy groups, dimethylsiloxane/methylphenylsiloxane copolymer capped at both molecular chain terminals with dimethylhydrogensiloxy groups, diphenylpolysiloxane capped at both molecular chain terminals with dimethylhydrogensiloxy groups, methylhydrogenpolysiloxane capped at both molecular chain terminals with trimethylsiloxy groups, methylhydrogensiloxane/dimethylsiloxane copolymer capped at both molecular chain terminals with trimethylsiloxy groups, methylhydrogensiloxane/dimethylsiloxane copolymer capped at both molecular chain terminals with dimethylhydrogensiloxy groups, and a mixture of two or more of these organopolysiloxanes. In the present invention, component (B) is exemplified by methylhydrogensiloxane/dimethylsiloxane copolymer capped at both molecular chain terminals with trimethylsiloxy groups, which has a viscosity of 1 to 500 mPas at 25° C. Component (B) may contain a resinous organohydrogenpolysiloxane resin.

Similarly, suitable component (C) contains the hydrosilylation reaction catalyst described above and preferably contains one or more curing agents selected from organic peroxides and photopolymerization initiators, depending on the choice of primarily curing reaction or secondarily curing reaction.

As a coating method for forming a curing reactive silicone gel on a substrate, a roll coat using a gravure coat, an offset coat, an offset gravure, an offset transfer roll coater, or the like, a reverse roll coat, an air knife coat, a curtain coat using a curtain flow coater, or the like, a comma coat, a meyer bar, or any other known method used for forming a cured layer can be used without limitation.

Preferred Combination of Primarily Curing Reaction Mechanism and Secondarily Curing Reaction Mechanism In the silicone gel according to the present invention, it is preferable that the curable silicone composition is cured into a gel form by a curing mechanism of a hydrosilylation reaction curing type, a dehydration condensation reaction curing type, a dealcoholization condensation reaction curing type, or a radical reaction curing type by high energy ray irradiation. In particular, a hydrosilylation reaction curing type at a low temperature of 100° C. or lower, a radical reaction curing type by high energy ray irradiation at room temperature, or a hydrosilylation reaction curing type by high energy ray irradiation is suitable.

The secondarily curing reaction of the silicone gel is preferably a curing reaction that proceeds at elevated temperatures above 100 degrees and is preferably a hydrosilylation reaction curing type or a peroxide curing reaction type. As described above, it is preferable to control the reaction so that the reaction is secondarily cured at a temperature higher than the melting temperature of the thermoplastic resin, which is the encapsulation wall material, by using the encapsulated hydrosilylation reaction catalyst.

Use as Adhesive

Since the curing reactive silicone gel of the present invention is in a gel form and is flexible and excellent in deformability and followingness, it can be suitably used as a temporary adhesive for temporarily holding a substrate or other member, or a semi-permanent adhesive for the purpose of semi-permanently adhering the substrate and other member. Specifically, in the case where the curing reactive silicone gel of the present invention does not contain an adhesive imparting component after the secondarily curing, the curing reactive silicone gel can be effectively held by contacting or arranging another member on the gel, and the member can be easily separated from the cured surface by causing the gel to undergo the secondarily curing reaction. In particular, the curing reactive silicone gel of the present invention is useful as a temporary adhesive because it does not cause the problem of residual adhesives (adhesive deposit). On the other hand, it is possible to form a cured product having semi-permanent adhesiveness to other members contacted or arranged on the gel by incorporating an adhesive-imparting functional group such as an epoxy group into a polymer or adding a known adhesive imparting agent such as an epoxysilane to the curing reactive silicone gel of the present invention as an adhesive component after the secondarily curing. At this time, the bonding mode of the other member to be bonded and the cured product obtained by secondarily curing of the gel can be a bonded state in which the failure mode at the time of adhesion failure becomes a cohesion mode, and can be used as a semi-permanent adhesive. Therefore, the curing reactive silicone gel of the present invention can be used by adjusting the bonding mode according to its application, and is particularly useful as an adhesive used for manufacturing electronic components.

Use as Protective Agent or Sealant

The curing reactive silicone gel of the present invention is a gel form, is flexible, has low elastic modulus, low stress, and excellent stress buffering properties, and can be used as a protective agent for various members by forming a strong cured product by secondarily curing. The curing reactive silicone gel of the present invention can also be used as a sealing material, a potting material, and a seal material, and is also suitable for use as a sealant. Such applications include architectural components, electrical and electronic components, vehicle components, and the like, but the curing reactive silicone gel of the present invention is particularly useful as an adhesive for use in the manufacture of electronic components.

Manufacturing Application of Electronic Component

The silicone gel of the present invention is particularly useful for the manufacture of electronic components, and by forming a silicone gel layer on various substrates to form an arrangement surface of the electronic component which is stable, flat, and excellent in stress relaxation property, it is possible to realize the advantage that the processing failure of the electronic component due to the surface unevenness of the substrate, positional deviation of the electronic component, and vibration displacement (damping) at the time of manufacture of the electronic component is unlikely to occur. Further, by curing the silicone gel layer, the electronic component can be easily peeled off from the cured product, and a defective product derived from a residue such as silicone gel (adhesive deposit) is hardly generated.

Laminate Used for Manufacturing Electronic Components

Specifically, the silicone gel of the present invention is useful as a silicone gel layer constituting a laminate for manufacturing an electronic component, and will be described below with respect to the laminate.

Substrate

The substrate on which the silicone gel layer is laminated may have unevenness, and it is particularly preferable that the unevenness is filled or followed without a gap by the silicone gel layer to form a flat silicone gel layer. Since the curing reactive silicone gel layer of the present invention is flexible and excellent in deformability and followingness, it is difficult to generate a gap even with respect to a substrate having unevenness, and it is advantageous in that problems such as a separation and a deformation of the silicone gel surface do not occur.

The substrate used in the present invention is not particularly limited, and a desired substrate may be appropriately selected. Examples of the substrate include adherends or substrates made of glass, ceramics, mortar, concrete, wood, aluminum, copper, brass, zinc, silver, stainless steel, iron, zinc coated steel, tin plate, nickel plated surfaces, epoxy resins, phenol resins, and the like. Further, an adherend or a substrate made of a thermoplastic resin such as a polycarbonate resin, a polyester resin, an ABS resin, a nylon resin, a polyvinyl chloride resin, a polyphenylene sulfide resin, a polyphenylene ether resin, or a polybutylene terephthalate resin is exemplified. They may be in the form of rigid plates or flexible sheets. Alternatively, the substrate may be a film-shaped or sheet-shaped substrate having extensibility such as that used for a substrate such as a dicing tape.

The substrate used in the present invention may be subjected to a surface treatment such as a primer treatment, a corona treatment, an etching treatment, a plasma treatment or the like for the purpose of improving adhesion and adhesiveness with the curing reactive silicone gel layer. As a result, even after the curing reactive silicone gel layer is cured to form a cured product layer having excellent shape retention and mold releasability, and even after low adhesion, the adhesion between the cured product layer and the substrate is kept sufficiently high, and separation of the electronic components and the like arranged on the cured product layer can be made easier.

On the other hand, in the case where the laminate of the present invention is used for manufacturing an electronic component, examples of the substrate include a pedestal on which the electronic component is at least temporarily arranged in the manufacturing process, a semiconductor wafer for the laminate application, a ceramic element including a ceramic capacitor, and a substrate which can be used as a substrate for the electronic circuit application. In particular, it is preferable that the substrate be usable as a pedestal, a circuit board, a semiconductor substrate, or a semiconductor wafer for processing electronic components.

Although the material of these substrates is not particularly limited, examples of members suitably used as a circuit board or the like include organic resins such as glass epoxy resin, bakelite resin, phenol resin, and the like; ceramics such as alumina; metals such as copper and aluminum; and materials such as silicon wafers for semiconductor use. Further, when the substrate is used as a circuit board, a conductive wire made of a material such as copper or silver-palladium may be printed on the surface of the substrate. The curing reactive silicone gel of the present invention is advantageous in that the unevenness of the surface of these circuit boards can be filled or followed without a gap to form a flat silicone gel surface.

On the other hand, the laminate of the present invention may be a laminate in which a curing reactive silicone gel layer is formed on a release layer of a sheet-shaped substrate (substrate R) provided with a release layer. In this case, the silicone gel layer can be easily peeled off from the substrate R, and only the silicone gel layer can be transferred onto another substrate, preferably the above-mentioned circuit board or semiconductor substrate. That is, the laminate of the present invention includes not only a laminate in which a silicone gel layer is formed on a non-peelable and uneven substrate such as a circuit board in advance, but also a concept of a peelable laminate for handling the silicone gel layer itself as a member of such a laminate.

The sheet-shaped substrate (substrate R) provided with the release layer is substantially flat, and a substrate having an appropriate width and thickness depending on the application of a tape, a film, or the like can be used without particular limitation, but specifically, a composite sheet-shaped substrate formed by laminating paper, a synthetic resin film, cloth, a synthetic fiber, a metal foil (aluminum foil, copper foil, or the like), glass fibers, and a plurality of these sheet-shaped substrates is exemplified. In particular, a synthetic resin film is preferable, and a synthetic resin film such as polyester, polytetrafluoroethylene, polyimide, polyphenylene sulfide, polyamide, polycarbonate, polystyrene, polypropylene, polyethylene, polyvinyl chloride, polyvinylidene chloride, polycarbonate, polyethylene terephthalate, nylon, or the like can be exemplified. The thickness is not particularly limited, but is usually about 5 to 300 μm.

As the release agent used for forming the release layer, for example, an olefin resin, an isoprene resin, a rubber elastomer such as a butadiene resin, a long chain alkyl resin, an alkyd resin, a fluorine resin, a silicone resin, or the like is used. In particular, the use of a release agent composed of a silicone resin is preferable, and the use of a release agent containing a fluorine-modified silicone resin containing a fluoroalkyl group is particularly preferable.

When the curing reactive silicone gel according to the present invention is formed on a sheet-shaped substrate (substrate R) provided with the above-mentioned release layer, when the curing reactive silicone gel is transferred to a substrate different from the substrate R, surface treatment such as a primer treatment, a corona treatment, an etching treatment, a plasma treatment, or the like may be performed on the silicone gel surface facing the substrate for the purpose of improving the adhesiveness and adhesive property of the curing reactive silicone gel. This improves the adhesion of the curing reactive silicone gel separated from the substrate R to other substrates.

Laminate Including Electronic Components

The laminate of the present invention may be further characterized in that at least one or more electronic components are arranged on the silicone gel layer. Though the type of the electronic component is not particularly limited as long as it can be arranged on the silicone gel layer, there are exemplified a semiconductor wafer, a ceramic element (including a ceramic capacitor), a semiconductor chip, and a light-emitting semiconductor chip which are elements of a semiconductor chip, and two or more electronic components which are the same or different may be arranged on the silicone gel layer. Since the curing reactive silicone gel layer in the laminate of the present invention is a gel form and can select curing conditions, even when it is handled in a temperature region at a high temperature to some extent, the curing reaction hardly progresses, and is moderately flexible and excellent in followingness and deformability, it is possible to form a stable and flat arrangement surface of an electronic component. Further, even when the electronic component arranged on the gel layer is stably held at a fixed position on a flat gel surface to alleviate vibration and shock in the manufacturing process of the electronic component, and processing such as processing of forming various patterns and dicing is performed on the electronic component, there is an advantage that processing defects of the electronic component due to surface unevenness of the substrate, positional deviation of the electronic component, and vibration displacement (damping) do not easily occur. The holding of the electronic component or the like on the gel is derived from the viscoelasticity of the gel, and includes both holding by the weak adhesive force of the gel itself and carrying of the electronic component by deformation of the gel.

These electronic components may be arranged on the silicone gel layer at least partially in a state of having a configuration of an electronic circuit, an electrode pattern, an insulating film, or the like, or after being arranged on the silicone gel layer, may form an electronic circuit, an electrode pattern, an insulating film, or the like. When the electrode pattern or the like is formed, conventionally known means can be used without any particular limitation, and the electrode pattern or the like may be formed by a vacuum evaporation method, a sputtering method, an electroplating method, a chemical plating method, an etching method, a printing method, or a lift-off method. When the laminate of the present invention is used for manufacturing an electronic component, it is particularly preferable to form an electronic circuit, an electrode pattern, an insulating film, or the like of the electronic component on the silicone gel layer, and the laminate may optionally be diced. As described above, the use of the silicone gel layer suppresses processing defects of these electronic components.

The laminate of the present invention is a laminate in which at least one or more electronic components described above are arranged on a silicone gel layer, and the silicone gel layer is cured, and may have a structure composed of a substrate, a cured layer, and at least one or more electronic components arranged on the cured layer.

Since the silicone gel layer is cured to form a cured layer having excellent shape retention, hardness, and surface releasability, only the electronic component can be easily separated from the cured layer in the laminate including the electronic component and the cured layer, and there is an advantage that foreign matter such as a residue (adhesive deposit) derived from the silicone gel hardly adheres to the electronic component and a defective product does not easily occur.

Manufacturing Method of Laminate

The laminate of the present invention is formed by forming a silicone gel layer on a substrate, and can be manufactured by applying a curable silicone composition, which is a raw material composition of the silicone gel layer, on a target substrate and curing it in a gel form as desired. Similarly, when a sheet-shaped substrate (substrate R) provided with the above-mentioned release layer is used, it can be manufactured by separating a silicone gel layer from the release layer and transferring the silicone gel layer onto another substrate.

That is, the laminate of the present invention can be obtained by a production method including a step (A-1) of coating a curable silicone composition capable of forming a silicone gel layer by primarily curing reaction on at least one type of substrate, and a step (A-2) of forming a curable reactive silicone gel layer by primarily curing of the curable silicone composition in a gel form on the substrate.

Here, the substrate may be a sheet-shaped substrate (substrate R) provided with the above-mentioned release layer, and in this case, the resulting laminate is a releasable laminate for transferring the curing reactive silicone gel layer as a member onto another substrate.

Similarly, the laminate of the present invention can be obtained by a production method including a step (B-1) of coating a curable silicone composition capable of forming a silicone gel layer by primarily curing reaction on a release layer of a sheet-shaped substrate (substrate R) provided with the release layer, a step (B-2) of forming a curable reactive silicone gel layer by primarily curing of the curable silicone composition in a gel form on the release layer, and a step of arranging the silicone gel layer of the laminate obtained in the above step on at least one type of substrate different from the above substrate R and removing only the substrate R.

In this case, a surface treatment such as a primer treatment, a corona treatment, an etching treatment, a plasma treatment, or the like may be performed on a surface of the silicone gel layer of the laminate, which is different from the above-mentioned substrate R and which faces at least one type of substrate, on a surface of the silicone gel facing the substrate for the purpose of improving its adhesiveness and adhesion property, and it is preferable. This improvement in adhesiveness has the advantage that the substrate R can be easily separated.

When a curing reactive silicone gel layer is formed on the sheet-shaped substrate (substrate R) provided with the above-mentioned release layer, and is later separated from the release layer and handled as a sheet-shaped member, a silicone gel layer having a uniform surface may be formed by the following method.

Method of Preparation Using Curing Between Separators Having Release Layer

Although it is preferable that the curing reactive silicone gel layer is substantially flat, when the curable silicone composition serving as a raw material thereof is applied onto a substrate having a release layer by a usual method, particularly when the thickness of the cured silicone gel layer is 50 μm or more, the applied surface may form a concave non-uniform surface, and the surface of the obtained silicone gel layer may become non-uniform. However, by applying a substrate having a release layer to the curable silicone composition and the silicone gel layer, sandwiching an uncured application surface with a sheet-shaped substrate (the above-mentioned substrate R; separator) provided with each release layer, and forming a physically uniform flattening layer, a flattened curing reactive silicone gel layer can be obtained. In forming the flattening layer, it is preferable that a laminate formed by applying an uncured curable silicone composition between separators having a release layer is rolled by a known rolling method such as roll sheeting.

Manufacturing Method of Electronic Components

A method of manufacturing an electronic component using the laminate includes a step (I) of arranging at least one or more electronic component on the silicone gel layer of the laminate of the present invention, a step (II) of curing a part or all of the silicone gel layer, and optionally a step (III) of separating the electronic component from the cured product obtained by curing a part or all of the silicone gel layer by the above step.

The electronic component is as described in the section [Laminate Including Electronic Components], and in the method for manufacturing an electronic component of the present invention, a step of forming an electronic circuit, an electrode pattern, an insulating film, and the like on the electronic component after being arranged on the silicone gel layer may be included, and it is preferable. Optionally, the laminate may be diced.

The step (II) of curing a part or all of the silicone gel layer is a step of secondarily curing of a curable silicone gel layer, and the silicone gel layer is changed into a hard cured layer having higher shape retention and superior mold releasability than before the curing reaction. As a result, in the subsequent step (III), the electronic component arranged on the silicone gel layer is easily separated, and a problem such as adherence of the silicone gel or a cured product thereof to the substrate or the electronic component is hardly caused.

EXAMPLES

Hereinafter, the present invention will be described by way of examples, but the present invention is not limited thereto. In the examples shown below, the following compounds or compositions were used as raw materials.

Component (A1-1): dimethylsiloxane polymer capped at both terminals with vinyldimethylsiloxy groups (polymerization degree of siloxane: about 540, vinyl group content: 0.13 weight %)

Component (A1-2): dimethylsiloxane polymer capped at both terminals with vinyldimethylsiloxy groups (polymerization degree of siloxane: about 315, vinyl group content: 0.22 weight %)

Component (A1-3): dimethylsiloxane/vinylmethylsiloxane copolymer capped at both terminals with trimethylsiloxy groups (polymerization degree of siloxane: about 1330, vinyl group content: about 0.47 weight %)

Component (A2): resinous organopolysiloxane composed of vinyldimethylsiloxy group-capped Q units (vinyl group content: about 4.1 weight %)

Component (B1): dimethylsiloxane polymer capped at both terminals with hydrogendimethylsiloxy groups (polymerization degree of siloxane: about 14, silicon bonded hydrogen group content: 0.13 weight %)

Component (B2): dimethylsiloxane/mercaptomethylsiloxane copolymer capped at both terminals with trimethylsiloxy groups (polymerization degree of siloxane: about 60, sulfur bonded hydrogen group content: 0.11 weight %)

Component (B3): dimethylsiloxane/hydrogenmethylsiloxane copolymer capped at both terminals with trimethylsiloxy groups (polymerization degree of siloxane: about 8, silicon bonded hydrogen group content: 0.76 weight %)

Hydrosilylation Reaction Inhibitor

Component (C1): 1,3,5,7-tetramethyl-1,3,5,7-tetravinyl-cyclotetrasiloxane (vinyl group content: 30.2 weight %).

Filler

Component (D1): hexamethyldisilazane-treated silica fine particle (Trade name "Aerosil 200V", manufactured by Nippon Aerosil)

Curing Agent

Component (E1): solution of platinum-divinyltetramethyldisiloxane complex in vinylsiloxane (about 0.6 weight % of platinum metal concentration)

Component (E2): 2-hydroxy-2-methyl-1-phenyl-propane-1-one

Component (E3): mixture of 2,5-dimethyl-2,5-di(tert-butylperoxy)hexane and siloxane polymer capped at both terminals with trimethylsiloxy groups (about 50 weight % in concentration of 2,5-dimethyl-2,5-di(tert-butylperoxy)hexane)

Dealcoholization Condensation Type Curing Reactive Silicone Composition SE9120 (Manufactured by Dow Toray Co., Ltd.)

Condensation curable silicone composition based on an organopolysiloxane containing an alkoxysilyl group and containing a condensation reaction catalyst Composition: Examples 1 to 7

In Examples 1 to 7 below, components (A1-1), (A1-2), (A2), (B1), (C1), (D1), (E1) and (E3) were used as described in Table 1. In this case, the amount of silicon atom-bonded hydrogen atoms (Si—H) of component (B1) was 0.25 to 0.50 mol per 1 mol of the vinyl group.

Composition: Examples 8 and 9

In Examples 8 and 9, components (A1-2), (A1-3), (B1), (D1), (E2) and (E3) were used as described in Table 2. In this case, the amount of sulfur atom-bonded hydrogen atoms (S—H) of component (B2) was 0.25 mol per 1 mol of the vinyl group.

Composition: Examples 10 to 12

In Examples 10 to 12, (A1-2), (A1-3), (B3), (C1), (D1), and (E1) were used as described in Table 3. In this case, the amount of silicon atom-bonded hydrogen atoms (Si—H) of component (B3) was 1.2 mol per 1 mol of the vinyl group. The resulting liquid silicone composition before curing was mixed with a dealcoholization condensation type curing reactive curable silicone composition (moisture cured) SE9120 (manufactured by Dow Toray Co., Ltd.) in the weight ratios (40:60, 30:70 or 20:80) listed in the table and used.

Composition: Comparative Examples 1 to 4

In Comparative Examples 1 to 4, as described in Table 4, the same components as in Examples 1 to 7 were used except that the silicon atom-bonded hydrogen atoms (Si—H) of component (B1) were used in amounts ranging from 0.2 to 0.25 mols per 1 mol of the vinyl group in the compositions. In the compositions, as shown in Table 4, even if cured under the same conditions, it does not cure into a gel form, and a silicone gel layer having curing reactivity cannot be formed.

Composition: Comparative Examples 5, 6, and 7

As described in Table 4, the same components as in Examples 8 and 9 were used except that only (E2) was used as the curing agent in Comparative Example 5 and only (E3) was used in Comparative Example 6. In Comparative Example 7, the same components as in Examples 1 to 7 were used except that only (E1) was used as the curing agent. In the compositions, as shown in Table 4, the silicone gel layer does not have secondarily curability even when cured under the same conditions.

Conditions for Preparation of Curable Gel Layer (1) Examples 1 to 7, Comparative Examples 1 to 4 and 7

The silicone composition before curing (liquid) was heated at 80° C. for 2 hours to proceed the hydrosilylation reaction to obtain a gel form product.

(2) Examples 8 and 9 and Comparative Examples 5 and 6

The liquid composition before curing was carried out at room temperature using a UV-irradiation device (MODEL UAW365-654-3030F, Centech, Inc.). In this case, a light source having a wavelength is 365 nm (about 40 mW/cm$^2$) was used and irradiated twice for 90 seconds (the irradiation amount per unit area was 7200 mJ/cm$^2$). At this time, in order to avoid contact between the high energy ray curable silicone composition and air, a PET film coated with a release agent and having a thickness of 50 microns was covered and irradiated with ultraviolet light. In Comparative Example 6, since there was no component (E2), a gel layer could not be prepared.

(3) Examples 10 to 12

The liquid composition before curing was left at room temperature for 1 hour to obtain a gel form product.

Conditions for Manufacturing Secondarily Cured Products (1) Examples 1 to 9 and Comparative Examples 1 to 4 and 7

The curable gel layer was secondarily cured in nitrogen at 170° C. for 1 hour.

(2) Examples 10 to 12

The curable gel layer was secondarily cured at 150° C. for 30 minutes.

Method for Measuring the Physical Properties of the Obtained Material

1. Measurement of Compressive Deformation Amount of Curing Reactive Silicone Gel 15 g of the liquid composition before curing of each of Examples 1 to 7 was put into a glass petri dish (diameter: 70 mm) and the composition prepared under the above conditions was used. Measurements were performed at room temperature using a texture analyzer TA. XT Plus (manufactured by EKO Instruments). The flat probe (diameter: 6 mm) was lowered at a rate of 0.17 mm per second to determine the amount of compressive deformation of the curable gel after reaching a maximum compressive force of 0.5 N.

2. Tack Measurement

Curing Reactive Silicone Gel (1) In Examples 1 to 7, after measuring the amount of compressive deformation, the flat probe was raised to a height equal to or greater than the initial thickness of the curable gel at a rate of 0.34 mm per second, and the maximum value of the load was measured as tack. Since the measured values are obtained as negative values, the absolute values are shown in the table. The higher this value, the more tack is present.

(2) In Examples 10 to 12, the liquid silicone composition before curing was applied to a thickness of 360 μm on a glass plate using a spacer, and the composition prepared under the above conditions was used. The presence or absence of tack was judged by touching with a hand.

Secondarily Cured Product

In Examples 10 to 12, the curable gel prepared was cured under the above conditions to obtain a secondarily cured product. The secondarily cured product thus obtained was touched by hand to determine the presence or absence of tack.

3. Measurement of Viscoelasticity

Curing Reactive Silicone Gel

The liquid silicone composition before curing was put into an aluminum container having a diameter of 50 mm so as to have a thickness of about 1.5 mm, and a test specimen was cut out from the curing reactive silicone gel obtained under the above conditions so as to have a diameter of 8 mm and used. Using a MCR302 viscoelasticity measuring device (manufactured by Anton Paar Corporation), samples cut out on parallel plates having diameters of 8 mm were attached and measured. Measurement was carried out at 23° C. at a frequency in the range of 0.01 to 10 Hz and under a strain of 0.5%. Each table shows the storage modulus and loss tangent (loss elastic modulus/storage modulus) at 0.1 Hz.

Secondarily Cured Product

In the same manner as described above, a curing reactive silicone gel was produced using an aluminum container. A secondarily cured product was obtained by further curing under the above manufacturing conditions. A test specimen was cut out from the obtained secondarily cured product so as to have a diameter of 8 mm and used. Using MCR302 (manufactured by Anton Paar Corporation), samples cut out on parallel plates having diameters of 8 mm were attached and measured. Measurement was carried out at 23° C. at a frequency in the range of 0.01 to 10 Hz and under a strain of 0.1%. Each table shows the storage modulus at 0.1 Hz.

TABLE 1

| Example No. | 1 | 2 | 3 | 4 | 5 | 6 | 7 |
| --- | --- | --- | --- | --- | --- | --- | --- |
| Component (A1-1) | 31.38 | 45.98 | 47.03 | 44.87 | 43.92 | 30.13 | 29.21 |
| Component (A1-2) | 34.59 | 5.96 | 6.07 | 6.09 | 5.98 | 33.24 | 32.26 |
| Component (A1-3) | | | | | | | |
| Component (A2) | 21.27 | 31.17 | 31.88 | 30.42 | 29.77 | 20.42 | 19.80 |
| Component (B1) | 8.51 | 12.63 | 10.75 | 14.36 | 16.08 | 11.95 | 14.47 |
| Component (B2) | | | | | | | |
| Component (B3) | | | | | | | |
| Component (C1) | 0.10 | 0.10 | 0.10 | 0.10 | 0.10 | 0.10 | 0.10 |
| Component (D1) | 2.08 | 2.08 | 2.08 | 2.08 | 2.08 | 2.08 | 2.08 |
| Component (E1) | 0.07 | 0.07 | 0.07 | 0.07 | 0.07 | 0.07 | 0.07 |
| Component (E2) | | | | | | | |
| Component (E3) | 2.00 | 2.00 | 2.00 | 2.00 | 2.00 | 2.00 | 2.00 |
| SiH/Vi ratio | 0.27 | 0.30 | 0.25 | 0.35 | 0.40 | 0.40 | 0.50 |
| Compression ratio/% | 50.08 | 17.44 | 25.32 | 7.46 | 3.47 | 14.42 | 3.57 |
| Tack/N* | 0.056 | 0.19 | 0.16 | 0.34 | 0.39 | 0.22 | 0.38 |
| Reactive gel storage modulus ($\times 10^3$ Pa) | 0.4 | 7.4 | 4.4 | 10.0 | 21.8 | 6.6 | 19.3 |
| Reactive gel loss tangent | 0.82 | 0.43 | 0.64 | 0.27 | 0.18 | 0.16 | 0.10 |
| Storage modulus after secondarily curing ($\times 10^5$ Pa) | 0.3 | 1.7 | 1.1 | 2.6 | 1.5 | 0.7 | 0.8 |

*Since it is a negative value, it is represented by an absolute value.

TABLE 2

| | Example No. | |
| --- | --- | --- |
| | 8 | 9 |
| Component (A1-1) | | |
| Component (A1-2) | 64.52 | 70.28 |
| Component (A1-3) | 27.80 | 23.13 |
| Component (A2) | | |
| Component (B1) | | |
| Component (B2) | 2.41 | 2.30 |
| Component (B3) | | |
| Component (C1) | | |
| Component (D1) | 2.08 | 2.08 |
| Component (E1) | | |
| Component (E2) | 0.20 | 0.20 |
| Component (E3) | 2.00 | 2.00 |
| SiH/Vi ratio | 0.26 | 0.25 |
| Reactive gel storage modulus ($\times 10^3$ Pa) | 8.2 | 8.4 |
| Reactive gel loss tangent | 0.03 | 0.04 |
| Storage modulus after secondarily curing ($\times 10^5$ Pa) | 0.4 | 0.8 |

TABLE 3

| | Example No. | | |
| --- | --- | --- | --- |
| | 10 | 11 | 12 |
| Component (A1-1) | | | |
| Component (A1-2) | 6.05 | 6.05 | 6.05 |
| Component (A1-3) | 88.90 | 88.90 | 88.90 |
| Component (A2) | | | |
| Component (B1) | | | |
| Component (B2) | | | |
| Component (B3) | 2.75 | 2.75 | 2.75 |
| Component (C1) | 0.11 | 0.11 | 0.11 |
| Component (D1) | 2.12 | 2.12 | 2.12 |
| Component (E1) | 0.07 | 0.07 | 0.07 |
| Component (E2) | | | |
| Component (E3) | | | |

TABLE 3-continued

| | Example No. | | |
|---|---|---|---|
| | 10 | 11 | 12 |
| SiH/Vi ratio | 1.2 | 1.2 | 1.2 |
| SE9120** | 60%** | 70%** | 80%** |
| Tack of reactive gel | Yes | Yes | Yes |
| Tack of secondarily cured product | No | No | No |

**Percentage in mixture (as 100 weight %) with the liquid silicone composition before curing made using Components A to E.

TABLE 4

| Comparative Example No. | 1 | 2 | 3 | 4 | 5 | 6 | 7 |
|---|---|---|---|---|---|---|---|
| Component (A1-1) | 31.89 | 26.25 | 37.59 | 26.63 | | | 47.99 |
| Component (A1-2) | 35.14 | 44.90 | 25.51 | 45.54 | 71.70 | 70.39 | 6.20 |
| Component (A1-3) | | | | | 23.62 | 23.19 | |
| Component (A2) | 21.62 | 17.79 | 25.48 | 18.05 | | | 32.53 |
| Component (B1) | 7.10 | 6.80 | 7.16 | 5.52 | | | 10.97 |
| Component (B2) | | | | | 2.36 | 2.32 | |
| Component (B3) | | | | | | | |
| Component (C1) | 0.10 | 0.10 | 0.10 | 0.10 | | | 0.11 |
| Component (D1) | 2.08 | 2.08 | 2.08 | 2.08 | 2.12 | 2.09 | 2.12 |
| Component (E1) | 0.07 | 0.07 | 0.07 | 0.07 | | | 0.07 |
| Component (E2) | | | | | 0.20 | | |
| Component (E3) | 2.00 | 2.00 | 2.00 | 2.00 | | 2.00 | |
| SiH/Vi ratio | 0.23 | 0.25 | 0.20 | 0.20 | | | 0.25 |
| SiH/Vi ratio | | | | | 0.25 | 0.25 | |
| Reactive gel storage modulus ($\times 10^3$ Pa) | — | — | — | — | Not measured. | Not measured.* | 4.0 |
| Reactive gel loss tangent | | | | | Not measured. | Not measured. | 0.69 |
| Curability | Reactive gel layer could not be obtained. | | | | No secondarily curability | | |

*Gel layer could not be formed.

The invention claimed is:

1. A curing reactive silicone gel obtained by primarily curing a composition containing the following components in a gel form and further having secondarily curing reactivity:
   (A) an organopolysiloxane having at least two curing reactive groups in one molecule;
   (B) optionally, an organohydrogenpolysiloxane; and
   (C) a curing agent;
   wherein the curing reactive silicone gel has a loss factor (tan δ) in the range of 0.01 to 1.00 at 23° C. to 100° C. when measured at a frequency of 0.1 Hz.

2. The curing reactive silicone gel according to claim 1, which has a loss factor (tan δ) in the range of 0.03 to 0.95 at 23° C. to 100° C. when measured at a frequency of 0.1 Hz.

3. The silicone gel according to claim 1, wherein a storage modulus (G'$_{cured}$) of a cured product of the curing reactive silicone gel obtained by a curing reaction is at least 100% larger than a storage modulus (G'$_{gel}$) of a silicone gel layer before curing.

4. The curing reactive silicone gel according to claim 1, which contains one or more curing agents selected from hydrosilylation reaction catalysts, peroxides, and photopolymerization initiators.

5. The curing reactive silicone gel according to claim 1, wherein the primarily curing is carried out in a temperature range of room temperature to 80° C.

6. The curing reactive silicone gel according to claim 1, which is secondarily curing reactive to heating, irradiation with high energy rays, or a combination thereof.

7. The curing reactive silicone gel according to claim 1, wherein component (A) is a mixture of:
   (A-1) a linear organopolysiloxane having at least two curing reactive groups in one molecule; and
   (A-2) a resinous or branched chain organopolysiloxane having at least two curing reactive groups in one molecule.

8. The curing reactive silicone gel according to claim 1, wherein:
   component (A) is a mixture of;
   (A-1) a linear organopolysiloxane having at least two alkenyl groups or photopolymerizable functional groups in one molecule, and
   (A-2) a resinous or branched chain organopolysiloxane having at least two alkenyl groups or photopolymerizable functional groups in one molecule;
   component (B) is an organohydrogenpolysiloxane having at least two silicon atom-bonded hydrogen atoms in one molecule;
   component (C) is a curing reaction catalyst containing hydrosilylation reaction catalyst; and
   the silicon atom-bonded hydrogen atoms in component (B) are in the range of 0.25 mol or more with regard to 1 mol of the alkenyl groups in components (A-1) and (A-2) of the composition.

9. The curing reactive silicone gel according to claim 1, which is in the form of a film or sheet having an average thickness in the range of 10 to 500 μm.

10. An adhesive comprising the curing reactive silicone gel according to claim 1.

11. An electronic component comprising the adhesive of claim 10.

12. A protective agent or a sealant comprising the curing reactive silicone gel according to claim 1.

13. An electronic component comprising the protective agent or the sealant of claim 12.

14. An electronic component comprising a cured product of the curing reactive silicone gel according to claim 1.

15. A member for manufacturing an electronic component, comprising a cured product of the curing reactive silicone gel according to claim 1.

* * * * *